United States Patent
Zeller (10) Patent No.: US 10,804,689 B2
(45) Date of Patent: Oct. 13, 2020

(54) METHODS AND SYSTEMS FOR EVALUATING ARC FLASH EXPOSURE HAZARD

(71) Applicant: Schweitzer Engineering Laboratories, Inc., Pullman, WA (US)

(72) Inventor: Mark L. Zeller, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 705 days.

(21) Appl. No.: 15/356,054

(22) Filed: Nov. 18, 2016

(65) Prior Publication Data

US 2018/0145496 A1    May 24, 2018

(51) Int. Cl.
| | |
|---|---|
| H02H 3/08 | (2006.01) |
| H02H 9/02 | (2006.01) |
| H02H 1/00 | (2006.01) |
| G01R 31/08 | (2020.01) |
| G01R 31/12 | (2020.01) |

(52) U.S. Cl.
CPC ......... *H02H 1/0023* (2013.01); *G01R 31/086* (2013.01); *G01R 31/1218* (2013.01); *H02H 1/0015* (2013.01)

(58) Field of Classification Search
CPC ...... H02H 1/0023; H02H 3/16; G01R 31/086; G01R 31/088
USPC ....................................................... 361/93.1
See application file for complete search history.

(56) References Cited

U.S. PATENT DOCUMENTS

| | | |
|---|---|---|
| 3,849,786 A | 11/1974 | Nanba |
| 4,285,164 A | 8/1981 | Moore |
| 4,369,364 A | 1/1983 | Kuntermann |
| 4,418,338 A | 11/1983 | Burt |
| 4,422,719 A | 12/1983 | Orcutt |
| 4,516,022 A | 5/1985 | Lindgren |
| 4,614,868 A | 9/1986 | Alster |
| 4,702,553 A | 10/1987 | Buchmuller |
| 4,791,518 A | 12/1988 | Fisher |
| 4,878,144 A | 10/1989 | Nebon |
| 4,978,863 A | 12/1990 | Lyons |

(Continued)

FOREIGN PATENT DOCUMENTS

| | | |
|---|---|---|
| EP | 249815 | 12/1987 |
| EP | 818075 | 1/1998 |

(Continued)

OTHER PUBLICATIONS

IEEE 1584, Guide for Performing Arc Flash Hazard Calculations, Industry Applications Society, Sep. 23, 2002.

(Continued)

*Primary Examiner* — Jared Fureman
*Assistant Examiner* — Lucy M Thomas
(74) *Attorney, Agent, or Firm* — Justin K. Flanagan; Bradley W. Schield (57) ABSTRACT

An arc flash validation system that detects incident energy produced by an arc flash is disclosed. The arc flash validation system comprises one or more power transformers (PT) and current transformers (CT). The voltage and current outputs from the PT and CT may indicate the incident energy of an arc flash. The PT and CT outputs may be stored in system memory. The arc flash validation system may analyze the stored data and compare the stored data to a predicted hazard level to generate a relay-event report.

22 Claims, 8 Drawing Sheets

(56) References Cited

U.S. PATENT DOCUMENTS

| | | | |
|---|---|---|---|
| 5,170,050 A | 12/1992 | Giboulet | |
| 5,208,542 A | 5/1993 | Tennies | |
| 5,682,101 A | 10/1997 | Brooks | |
| 5,771,091 A | 6/1998 | Paritsky | |
| 5,940,547 A | 8/1999 | Schumacher | |
| 5,986,860 A | 11/1999 | Scott | |
| 6,011,480 A | 1/2000 | Schweitzer | |
| 6,124,706 A | 9/2000 | Woods | |
| 6,229,680 B1 | 5/2001 | Shea | |
| 6,292,105 B1 | 9/2001 | Land | |
| 6,377,055 B1 * | 4/2002 | Macbeth | G01R 31/3275 324/522 |
| 6,433,976 B1 | 8/2002 | Phillips | |
| 6,476,396 B1 | 11/2002 | Forsyth | |
| 6,693,438 B2 | 2/2004 | Shea | |
| 6,920,028 B2 | 7/2005 | Schweitzer | |
| 7,035,068 B2 | 4/2006 | Shea | |
| 7,359,168 B2 | 4/2008 | Elms | |
| 7,397,596 B2 | 7/2008 | Yacoubian | |
| 7,526,393 B2 | 4/2009 | Thurmond | |
| 7,536,914 B2 | 5/2009 | Land | |
| 7,580,232 B2 | 8/2009 | Caggiano | |
| 7,750,646 B2 | 7/2010 | Maity | |
| 7,791,846 B2 | 9/2010 | Roscoe | |
| 7,952,360 B2 | 5/2011 | Ganesh | |
| 8,154,730 B2 | 4/2012 | Wu | |
| 8,319,173 B2 | 11/2012 | Schweitzer, III | |
| 8,451,572 B2 | 5/2013 | Schweitzer, III | |
| 8,593,769 B2 | 11/2013 | Schweitzer, III | |
| 8,664,961 B2 | 3/2014 | Zeller | |
| 8,675,329 B2 | 3/2014 | Schweitzer, III | |
| 8,735,798 B2 | 5/2014 | Kesler | |
| 8,803,069 B2 | 8/2014 | Kesler | |
| 9,046,391 B2 | 6/2015 | Schweitzer | |
| 9,515,475 B2 | 12/2016 | Kesler | |
| 2003/0205460 A1 | 11/2003 | Buda | |
| 2004/0054921 A1 | 3/2004 | Land | |
| 2004/0125532 A1 | 7/2004 | Schweitzer | |
| 2005/0135025 A1 | 6/2005 | Escoda | |
| 2005/0203672 A1 | 9/2005 | Restrepo | |
| 2006/0261259 A1 | 11/2006 | Beinhocker | |
| 2007/0014060 A1 | 1/2007 | Land | |
| 2007/0070568 A1 | 3/2007 | Potter | |
| 2007/0108986 A1 | 5/2007 | Moore | |
| 2007/0132458 A1 | 6/2007 | Allen, Jr. | |
| 2007/0242402 A1 | 10/2007 | Papallo | |
| 2008/0004853 A1 | 1/2008 | Radibratovic | |
| 2008/0094612 A1 | 4/2008 | Land | |
| 2008/0170344 A1 | 7/2008 | Byron | |
| 2008/0239592 A1 | 10/2008 | Roscoe | |
| 2008/0310058 A1 | 12/2008 | Premerlani | |
| 2009/0161272 A1 | 6/2009 | Asokan | |
| 2009/0189615 A1 | 7/2009 | Kinsel | |
| 2010/0026425 A1 | 2/2010 | Roscoe | |
| 2010/0072352 A1 | 3/2010 | Kesler | |
| 2010/0073013 A1 | 3/2010 | Zeller | |
| 2010/0073830 A1 | 3/2010 | Schweitzer, III | |
| 2010/0073831 A1 * | 3/2010 | Schweitzer, III | G01R 31/1218 361/42 |
| 2010/0118473 A1 | 5/2010 | Morris | |
| 2011/0128005 A1 * | 6/2011 | Weiher | H02H 3/044 324/424 |
| 2011/0299200 A1 | 12/2011 | Yanniello | |
| 2012/0002195 A1 | 1/2012 | Wu | |
| 2012/0123603 A1 * | 5/2012 | Werner | H02H 7/261 700/292 |
| 2012/0312971 A1 | 12/2012 | Kesler | |
| 2012/0312977 A1 | 12/2012 | Schweitzer, III | |
| 2013/0044395 A1 | 2/2013 | Rodgers | |
| 2015/0244160 A1 | 8/2015 | Schweitzer | |
| 2016/0246906 A1 * | 8/2016 | Radibratovic | G06F 17/5009 |

FOREIGN PATENT DOCUMENTS

| | | |
|---|---|---|
| EP | 1646119 | 4/2006 |
| WO | 8808217 | 10/1988 |
| WO | 221657 | 3/2002 |

OTHER PUBLICATIONS

IEEE 1584a, IEEE Guide for Performing Arc-Flash Hazard Calculations—Amendment 1, IEEE Industry Applications Society, Nov. 29, 2004.

PCT/US2009/057531 Patent Cooperation Treaty, International Search Report and Written Opinion of the International Searching Authority, dated Nov. 19, 2009.

VAMP Arc Protection Series, VAMP 121, VAMP 221, Jun. 24, 2008.

UTU Arc Protection Systems—a possibility to be protected, Feb. 27, 2002.

George Roscoe, Marcelo E. Valdes, Ray Luna, Methdos for Arc-Flash Detection in Electrical Equipment, Petroleum and Chemical Industry Conference, 2010 Record of Conference Papers Industry Applications Society, Sep. 20-22, 2010.

PCT/US2009/057520 Patent Cooperation Treaty, International Search Report and Written Opinion of the International Searching Authority, dated Nov. 19, 2009.

PCT/US2009/057536 Patent Cooperation Treaty, International Search Report and Written Opinion of the International Searching Authority, dated Nov. 19, 2009.

PCT/US2009/057541 Patent Cooperation Treaty, International Search Report and Written Opinion of the International Searching Authority, dated Nov. 10, 2009.

PCT/US2009/057548 Patent Cooperation Treaty, International Search Report and Written Opinion of the International Searching Authority, dated Dec. 3, 2009.

Kevin Lippert, Donald M. Colaberardino, Clive W. Kimblin, Understanding IEEE 1584 Arc Flash Calculations, IEEE Industry Applications Magazine, May 2005.

ABB, Arc Protection Relay, Product Guide REA 10_, Jun. 22, 2005.

ABB, Arc Protection System REA, Jun. 2005.

Robert Wilson, Rainer Harju, Juha Keisala, Sethuraman Ganesan, Tripping with the Speed of Light: Arc Flash Protection, Mar. 27, 2007.

Meyle, LBW21 Arc Detection System Operating Instruction, Dec. 2004.

European Search Report, dated Aug. 5, 2013 for European Patent Application 09815287.9.

European Search Report, dated Aug. 5, 2013 for European Patent Application 09815298.6.

European Search Report, dated Jul. 2, 2013 for European Patent Application 09815295.2.

* cited by examiner

| | | |
|---|---|---|
| 472 { | 474A CATEGORY 0 | UP TO 1.2 CAL/CM$^2$ |
| | 474B CATEGORY 1 | 1.2 CAL/CM$^2$ TO 4 CAL/CM$^2$ |
| | 474C CATEGORY 2 | 4 CAL/CM$^2$ TO 8 CAL/CM$^2$ |
| | 474D CATEGORY 3 | 8 CAL/CM$^2$ TO 25 CAL/CM$^2$ |
| | 474E CATEGORY 4 | 25 CAL/CM$^2$ TO 40 CAL/CM$^2$ |

METHODS AND SYSTEMS FOR EVALUATING ARC FLASH EXPOSURE HAZARD

TECHNICAL FIELD

The present disclosure relates generally to systems and methods to validate arc flash predictions and/or measure arc flashes. More specifically, the present disclosure relates to the systems and methods of generating and utilizing a relay-event report to validate arc flash predictions and/or measure arc flashes.

BACKGROUND

Arc flash is a condition that arises when an arcing fault between multiple phases, or one or more phases to ground, rapidly releases energy. In an arc fault, the air between the conductors becomes ionized, subsequently enabling an arcing event. Arc events may induce temperatures that reach or exceed 20,000° C., vaporize conductors and/or adjacent materials, and release an explosive energy in the form of an arc flash. An arc flash can produce high heat, intense light, and acoustic waves similar to that of an explosion. An arc flash incident can result in instantaneous damage to personnel and equipment in the vicinity. Calculations and predictions are typically used to predict a hazard level of a potential arc flash for a specific work area. When entering a specific work area where an arc flash hazard is high, a person is required to wear protective equipment and clothing. One of the problems frequently encountered when calculating or predicting arc flash hazard levels is validating whether the calculations or predictions were reasonably accurate. Disclosed herein is a system and method for generating and utilizing a relay-event report to validate the predictions and/or to generate estimate the size of an arc flash.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

An arc flash validation system may generate a relay-event report to validate the accuracy of calculations or predictions for arc flash hazard levels. An arc flash validation system may include one or more intelligent electronic devices (IEDs) installed in an electrical power transmission or distribution facility to detect an arc flash event, as well as measure current and voltage of the detected arc flash event. The arc flash validation system may use an electrical monitoring device (e.g., current transformer, power transformer) to receive current and voltage values from an electrical conductor.

The received values may be used to calculate the incident energy of the arc flash (given the arc current, resistance, and conductor gap). The "Guide for Performing Arc Flash Hazard Calculations," which is promulgated by the Institute of Electrical and Electronics Engineers (IEEE) as IEEE 1584, provides several means for calculating arc flash incident energy.

For example, IEEE 1584 provides for determining arc flash incident energy as follows:

$$\text{Log}(E_N) = K_1 + K_2 + 1.0811 * \text{Log}(I_a) + 0.0011 * G \quad \text{Equation 1.1}$$

In Equation 1.1, EN is the arc flash incident energy, K1 is a switchgear dependent constant value (depending upon whether the switchgear is in an open or box configuration), K2 is a constant (0 for ungrounded or high-resistance grounded switchgear, and −0.113 for grounded systems), Ia is the maximum arcing current, and G is a gap between conductors, or to ground, within the switchgear.

The IEEE 1584 standard further provides means for determining an arc-protection boundary as follows:

$$D_b = \left[ 4.184 \cdot C_f \cdot E_n \cdot \left( \frac{t}{0.2} \right) \cdot \left( \frac{610^x}{E_b} \right) \right]^{\frac{1}{x}} \quad \text{Equation 1.2}$$

In Equation 1.2, Db is the distance of the boundary from the arcing point, Cf is a voltage constant (1.0 for voltages above 1 kV), En is the normalized arc flash incident energy (e.g., calculated per Equation 1.1 above), Eb is the incident energy at the boundary (5.0 J/cm2 for bare skin), and x is a distance exponent constant (0.973 for 5 kV switchgear).

The protection boundary may determine where maintenance personnel may safely work in relation to the switchgear. In addition, the protection boundary may determine what protection gear, if any, maintenance personnel should use.

Other standards exist for calculating arc flash energy and protection boundary values. For example, the National Fire Protection Association (NFPA) derives an arc thermal performance value (ATPV) similar to the IEEE 1584 arc flash incident energy. The ATPV may determine a proximity boundary in which maintenance personnel may work. In addition, the ATPV and proximity boundary may indicate the nature of the protective clothing systems used by the personnel. Other arc flash safety-related standards are provided by the National Electric Code (NEC) and Occupational Safety and Health Administration (OSHA).

The NFPA 70E, "Standard for Electrical Safety in the Workplace," assigns hazard levels ranging from 0 through 4 to incident energies up to and including 40 cal/cm2. NFPA 70E also provides examples of typical personal protective equipment appropriate for each hazard category. Verification of equations, calculations, and values produced from an arc flash is necessary to evaluate the accuracy of the predicted incident energies so that proper equipment is worn based on the actual hazard levels.

The embodiments described herein include methods and systems for evaluating an arc flash exposure hazard, and comparing the actual hazard measurements with predicted hazard measurements. In some instances, the hazard measurements may be worse than the predicted measurements, in which case a hazard redefinition module may increase the hazard level. Alternatively, an arc flash hazard validation system may indicate that the actual hazard measurements closely correlate the predicted measurements, which may validate the accuracy of the predicted hazard measurements.

The phrases "coupled to," "communicatively coupled to," and "in communication with" are broad enough to refer to any suitable coupling or other form of interaction between two or more components, including mechanical, fluid, and thermal interaction. Two components may be coupled to each other even though there may be intermediary devices between the two components.

A "protection relay" or "relay" is a switch that can open and/or close one or more circuits electromechanically or electronically. A relay may protect distribution circuits by tripping and closing a breaker under abnormal conditions. Protective relays can prevent equipment damage by detecting electrical abnormalities, including an arc flash event.

As used herein, the term "IED" may refer to any one or combination of a central processing unit (CPU)-based relay and/or protective relay, a communication processor, a digital fault recorder, a phasor measurement unit (PMU), a phasor measurement and control unit (PMCU), a phasor data concentrator (PDC), a wide area control system (WACS), a relay with phasor measurement capabilities, a wide area protection system (WAPS), a Supervisory Control and Data Acquisition (SCADA) system, a system integrity protection scheme, or any other device capable of monitoring and/or protecting an electrical power system. The term "IED" may be used interchangeably to describe an individual IED or a system comprising multiple IEDs. In one embodiment, the IED may be capable of providing arc flash protection by detecting voltage reductions and/or current surges. In another embodiment, the IED may be capable of providing arc flash protection using one or more light detection devices.

To detect an arc flash event, the IED may utilize one or more light detection devices, which may comprise one or more point detectors. The light detection devices may comprise a fiber-optic component, such as a fiber-optic lead, capable of collecting light and transmitting a portion of the light to an IED. In one embodiment, the IED may include a photodetector or other light detecting means to detect the light detected by the point detectors. In other embodiments, the point detectors may be communicatively coupled to a respective local photodetector. The local photodetectors may be configured to detect light transmitted by the point detectors, convert the detected light to an electrical signal and/or discrete value (e.g., using an analog-to-digital (A/D) converter or the like), and transmit the electrical signal and/or value to the IED over a communications network.

Any "communications network" or "network" disclosed herein may include a wide variety of network infrastructures. Specifically, a network may incorporate landlines, wireless communication, optical connections, various modulators, demodulators, small form-factor pluggable (SFP) transceivers, routers, hubs, switches, and/or other networking equipment. The network may include communications or networking software, such as software available from Novell, Microsoft, Artisoft, and other vendors, and may operate using TCP/IP, SPX, IPX, SONET, and other protocols over twisted pair cables, coaxial cables, optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

According to one embodiment, the fiber-optic component of the point detection devices may include a fiber-optic loop comprising a fiber-optic element (e.g., one or more fiber-optic filaments) encased in a sheath. Portions of the fiber-optic loop sheath may be removed, which may allow those portions of the loop to collect light. The light detected by the fiber-optic loop may be transmitted to the aforementioned IED. The photodetector or light detecting means of the IED may be configured to detect and/or quantify the light captured by the fiber-optic loop. In another embodiment, the fiber-optic loop may be coupled to one or more local photodetectors, which convert the light detected by the loop into an electrical signal and/or discrete value (e.g., using an A/D converter or the like). The fiber-optic cable may transmit the electrical signal and/or value to the IED over a communications network.

As disclosed herein, a light detection device, such as the point detectors and/or fiber-optic loop, may be configured to capture electro-optical (EO) radiation at any number of different wavelengths, including but not limited to visible EO radiation (e.g., visible light), infra-red (IR) EO radiation, ultra-violet (UV) EO radiation, or EO radiation at other wavelengths. Moreover, as used herein, "light" or a "light event" may refer to EO radiation that comprises EO energy at many different wavelengths, some of which may be visible to the human eye and some of which may not. Therefore, this disclosure should not be read as limited to detection and/or processing of only human-visible EO radiation, but should be read as encompassing any EO radiation type known in the art.

In one embodiment, once the light detection device detects a portion of the EO radiation produced by the light event, it transmits the detected portion to an arc flash detection unit within the IED. The arc flash detection unit may comprise a light sensor, which may receive the detected portion of the light event and convert it into an electrical signal. According to some embodiments, the electrical signal may be amplified by an amplifier and sampled (e.g., converted into a discrete value) by an A/D converter. Alternatively, according to one embodiment, the light sensor, amplifier, and/or A/D converter may transmit the signal to the arc flash detection unit.

In one embodiment, the A/D converter then transmits a signal to an overlight element. The overlight element may compare the sampled light measurement to an overlight threshold value. The overlight threshold value may indicate the light value produced by an arc flash event (e.g., as opposed to changes in ambient light conditions or the like). The overlight element may be a simple comparator that compares the input against a threshold, and gives a high output if the input exceeds the threshold. The overlight element may be programmed to calculate the values for the time and intensity of the light, such that it will only give a high output if the intensity of the signal from the A/D holds for a predetermined time. For example, the time period may be relatively short for high-intensity EO radiation measurements and relatively long for lower-intensity EO radiation measurements. The overlight element may comprise an integrator, which may detect an overlight condition if a particular time intensity is achieved within a predetermined time period (e.g., sliding window). Alternatively, the overlight element may be programmed to give a high output only if the intensity reaches a predetermined value independent of the time. If the overlight element determines that the light measurement was of a sufficient period of time and/or intensity that the measurement exceeds the threshold, the overlight element then asserts an arc flash detection output. The arc flash detection output may then be relayed to an AND gate.

An IED may be communicatively connected to a current transformer (CT) to measure current. A CT may be coupled to a conductor producing an alternating current through its secondary winding, which is proportional to the phase current being measured through the primary winding. This proportional relationship is expressed as the CT ratio. The CT output is a much lower value, which enables the IED to monitor the actual phase current value. The CT output may flow to the IED, which may filter the current using a filter. The filter may comprise a low-pass filter, and the IED may sample the filter's output to produce one or more discrete current measurement values (e.g., using an A/D converter, or the like).

In one embodiment, the current measurements may flow to an absolute value block (e.g., rectifier), which may generate an absolute value of the filtered current measurements. The rectified current measurements may be collected and/or stored as discrete values in the arc flash-validation-system memory (AFVSM). The AFVSM may include static RAM, dynamic RAM, flash memory, one or more flip-flops, ROM, CD-ROM, DVD, disk, tape, magnetic storage, optical storage, or other computer storage medium. The AFVSM may store and organize a relay-event report from one or more databases.

The rectified current measurements may also flow to a comparator, which may compare the measurements to a threshold. If the filtered, rectified current measurements exceed the threshold, an output of the comparator may be asserted. The threshold may be an overcurrent threshold indicative of an arc flash event. If a current exceeds the threshold, the comparator may assert an output to the AND gate.

The AND gate may receive two inputs, one from the overlight element, and the other in the form of an overcurrent. If both the inputs to the AND gate are asserted (e.g., the overlight input and the overcurrent input), the AND gate may assert an output. The output of the AND gate may comprise an arc-event detection signal. The output of the AND gate then flows to a trip signal generator. The arc flash detection unit may be communicatively coupled (e.g., via a direct wire-to-wire connection, an RS232 cable, a direct electrical connection, or the like) to the trip signal generator and/or one or more arc flash detection inputs.

According to one embodiment, the trip signal generator may be configured to transmit a signal to protective equipment within the arc flash detection system, such as a circuit breaker, an IED, a human-machine interface (HMI), or the like. Upon receiving an arc flash detection signal, the circuit breaker may trip, which may provide protection to the electrical power system and/or minimize the energy released by the fault and/or arc flash. In some embodiments, the trip signal generator may be configured to transmit the arc flash detection signal in a particular format and/or protocol, such as a SCADA control message, an IEEE C37.118 message, a network message, or another control system. As will be appreciated by one of skill in the art, any signaling and/or control mechanism could be used under the teachings of this disclosure (e.g., generated by the trip signal generator). In one embodiment, the trip signal generator may also send a signal to the AFVSM with discrete values (e.g., using an A/D converter, or the like).

In addition to the CT, the IED may also communicate with a power transformer (PT). The PT functions to reduce the phase voltage by the PT ratio. The PT output is a much lower value, which enables the IED to monitor the actual phase voltage value. The voltage output from the PT may flow to the arc flash detection unit, which may filter the voltage measurement using a filter. The filter may comprise a low-pass filter, and the IED may sample the filter's output to produce one or more discrete voltage measurement values (e.g., using an A/D converter, or the like). In one embodiment, an amplifier may amplify the voltage before the voltage passes through an A/D converter. The discrete voltage measurements may then be collected and/or stored in the AFVSM.

In some embodiments, the IED may lack light detection devices. In such embodiments, to detect an arc flash event, the IED may utilize the measured current and voltage. For example, an arc flash event may be detected when one or both of the measured current and voltages reach a threshold limit value within a short period of time.

A signaling mechanism may send the discrete values stored in the AFVSM to one or more analytic modules. The analytic module may use the stored measurements and/or values of the actual voltage, the actual current, the absolute value of the current, and/or the values generated by the trip signal to calculate the incident energy of the arc flash event. The analytic module may compare the actual incident energy of the arc flash event with the predicted incident energy. The analytic module may also receive test algorithms and/or test commands for use in the comparison. The analytic module may analyze the measurement data in calories per working distance (cal/cm2). In addition to the comparison with the predicted incident energy, the analytic module may make other comparisons. For example, the measurement data from a first arc flash event may be compared to a second arc flash event. As will be appreciated by one of skill in the art, any comparison could be used under the teachings of this disclosure (e.g., whether the breaker is operating under the predicted parameters).

A communication network may transmit measurement data to the analytic module from one or more devices, such as a computing device, an IED, or a mobile computing device. The analytic module may generate data and/or results from one or more comparisons as a relay-event report, with comparisons expressed in terms of calories per working distance (cal/cm2). The relay-event report may utilize one or more computer software programs (e.g., an electronic-mail program) and/or one or more user interfaces (e.g., a light that blinks or changes colors) to provide a visual indication of the results from the comparisons.

A relay-event report may be used for a multitude of studies. Some examples include: (1) utilization of a relay-event report to validate predictions, (2) assessing whether the predicted hazard safety zones align with what the hazard safety zones should be based on the measured values, and (3) informing an operator that the breaker is not operating within a set of desired parameters.

An arc flash hazard validation system may include a processor (which may be a microprocessor, field programmable gate array (FPGA), application specific integrated circuit (ASIC), or the like) that may be configured to coordinate one or more desired functions (e.g., measure, compare, analyze, normalize, etc.). A processor may perform distributed (e.g., parallel) processing to execute or otherwise implement functionalities of the present embodiments. A processor may run a standard operating system and perform standard operating system functions. It is recognized that any standard operating system may be used, such as, for example, Microsoft® Windows®, Apple® MacOS®, Disk Operating System (DOS), UNIX, IRJX, Solaris, SunOS, FreeBSD, Linux®, QNX®, ffiM® OS/2® operating systems, and so forth. An arc flash hazard validation system may further comprise an HMI, which may include a display, an attached computer, or the like. The computer storage media may contain one or more input/output interfaces that facilitate HMI. The input device(s) may include a keyboard, mouse, button, touch screen, light pen, tablet, microphone, sensor, or other hardware with accompanying firmware and/or software. The output device(s) may include a monitor or other display, printer, speech or text synthesizer, switch, signal line, graphical user interface, or other hardware with accompanying firmware and/or software.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that perform one or more tasks or implement particular abstract data types. A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. According to one embodiment, a database management system (DBMS) allows users to interact with one or more databases and provides access to the data contained in the databases.

The arc flash hazard validation system may function as one or more modules. A module may include all or portions of other elements of the system. The modules may run multiple operations concurrently or in parallel by or on one or more processors. Portions of the disclosed modules, components, and/or facilities are embodied as executable instructions embodied in hardware or firmware, or stored on a non-transitory, machine-readable storage medium. The instructions may comprise computer program code that, when executed by a processor and/or computing device, causes a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. Portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

The systems and methods described herein may be expanded for use in an enterprise and/or industrial environment in which a validation module or validation device may be in communication with any number (i.e., hundreds or even thousands) of pairs of computer modules or other devices functioning in dual-primary or primary-backup configurations. Accordingly, a centralized validation system may be capable of remotely validating the functionality of measurement devices and/or IEDs throughout an electric power delivery system. Similarly, a detection module device may be adapted to monitor and regularly validate the functionality of measurement devices and/or IEDs within a substation of an electric power delivery system.

Figure 1:
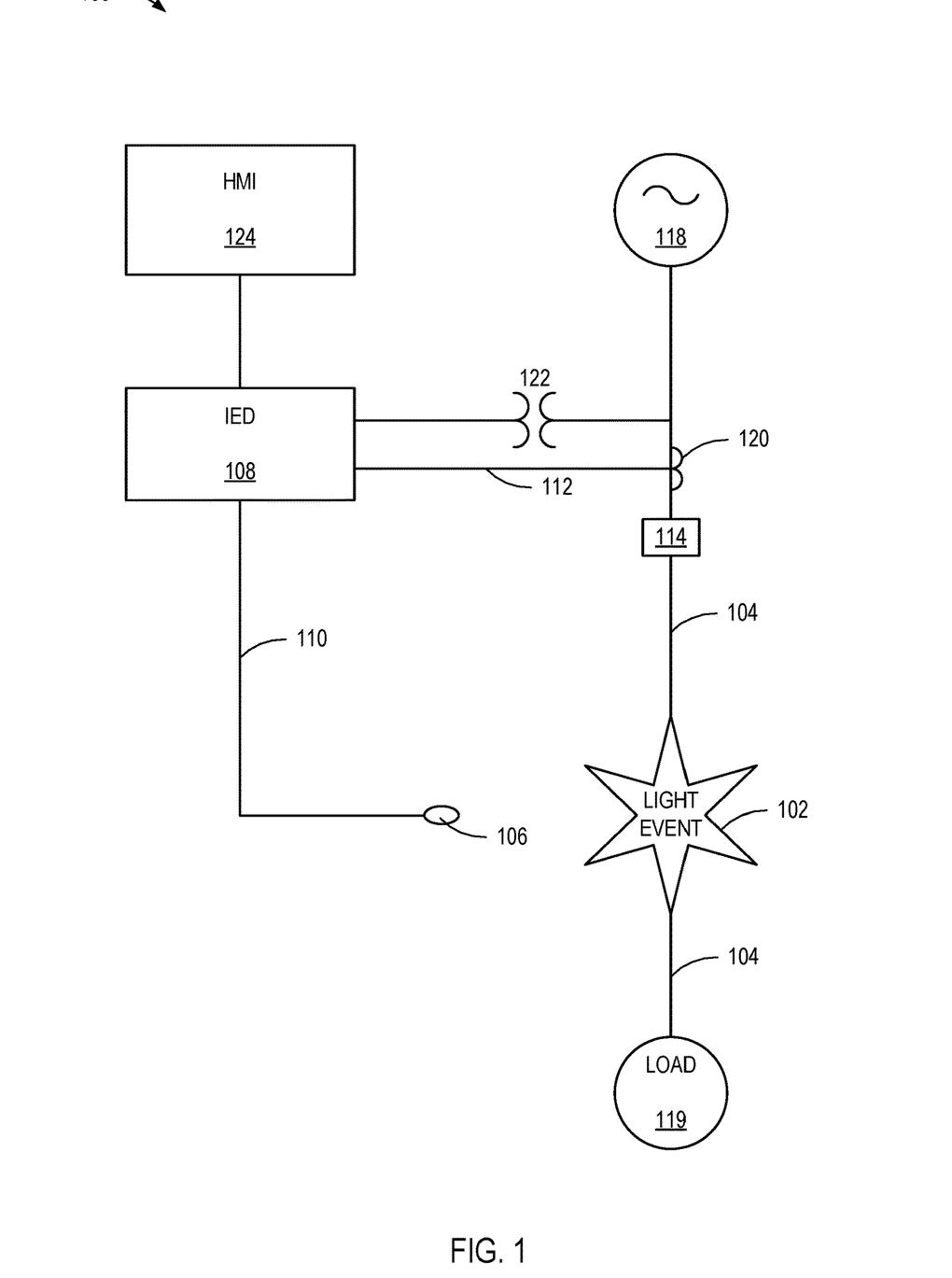
FIG. 1 illustrates an overview of an arc flash detection and validation system, according to one embodiment.

FIG. 1 illustrates an arc flash detection and validation system 100, according to one embodiment. The arc flash detection and validation system 100 may include a light detection device 106, an IED 108, a circuit breaker 114, a CT 120, a PT 122, and an HMI 124. A short across phase conductors 104 may trigger an arc flash. The arc flash detection and validation system 100 may detect an arc flash incident, measure the energy of the incident, and generate a relay-event report.

The light detection device 106, CT 120, and/or PT 122 may detect an arc flash incident. For example, the arc flash may cause a light event 102. The light detection device 106 may detect the light event 102 and transmit a signal indicating the detection over a conductor 110 to the IED 108. Additionally, the CT 120 may measure current and transmit the measurements to the IED 108. The PT 122 may measure voltage and transmit the voltage measurements to the IED 108. These measurements may indicate an arc flash. For example, the CT 120 may measure an abrupt overcurrent, or the PT 122 may measure a voltage spike during an arc flash. In response to an overcurrent and/or voltage spike, the CT 120 or the PT 122 may transmit a signal indicating a possible arc flash.

The light event 102, overcurrent, and/or voltage spike may be considered by the IED 108 individually, in various combinations, and/or collectively to determine if an arc flash occurred. In one embodiment, any one of these events may be enough for the IED 108 to determine an arc flash occurred. For example, the IED 108 may determine an arc flash occurred if a light event 102 is detected. In an alternative embodiment, multiple events may be needed for the IED 108 to determine an arc flash occurred. For instance, the IED 108 may determine an arc flash occurred if a light event 102 and an overcurrent or voltage spike are detected. In yet another embodiment, all three events must be present for the IED 108 to determine an arc flash occurred.

In one embodiment, the IED 108 may be a protective relay such as a SEL 751 manufactured by and available from Schweitzer Engineering Laboratories, Inc. of Pullman, Wash. In one embodiment, on sensing a simultaneous light event 102 and overcurrent, the IED 108 may initiate a high-speed trip. For example, the IED 108 may send a trip signal 112 to the circuit breaker 114, which trips and shuts off the electrical flow from a power source 118 to a load 119.

When the IED 108 detects an arc flash, a storage device may store the current and voltage measurements taken during and around the arc flash. In one embodiment, the storage device may continuously store a plurality of current and voltage measurements. For example, the storage device may store measurements taken during a first time period (e.g., 10 seconds, 1 minute, or 1 hour). To prevent the storage device from filling, the measurements taken during the first time period may be replaced by measurements taken during a succeeding second time period. The first and the second time periods may be continuous or there may be a break between measurements. The IED 108 may flag a time period as having an arc flash event, and modify a file associated with the measurements during that time period to indicate that the measurements should not be overwritten. The arc flash detection and validation system 100 may generate a relay-event report based on the measured values.

The relay-event report and digital measurement values collected from the CT 120, PT 122, and light detection device 106 may be subsequently relayed to the HMI 124. The HMI 124 may display the relay-event report and measurement values.

Figure 2:
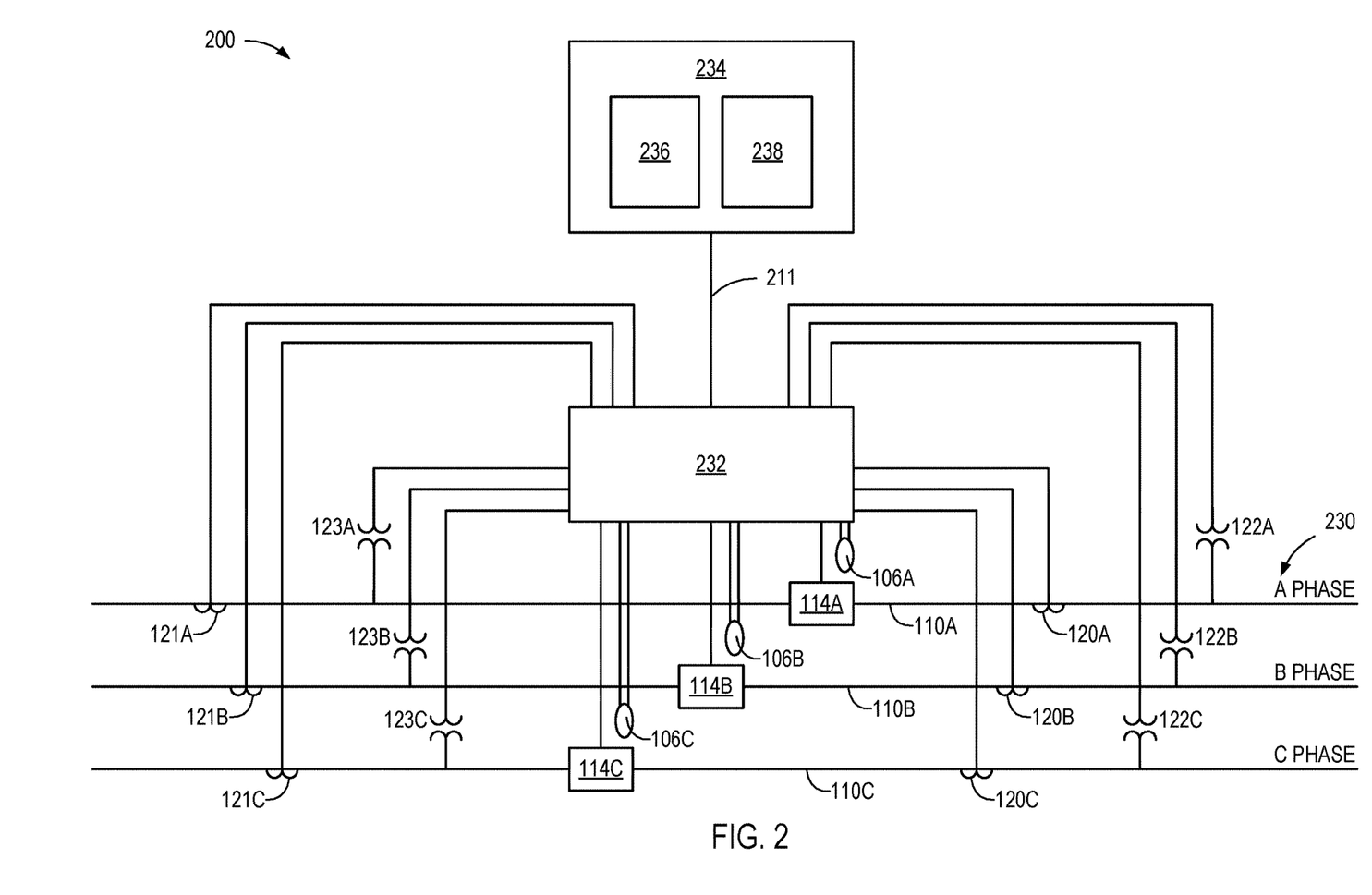
FIG. 2 is a block diagram of an arc flash detection and validation system installed on a three-phase system, according to one embodiment.

FIG. 2 is a block diagram of an arc flash detection and validation system 200 installed on a three-phase system 230. The arc flash detection and validation system 200 may provide monitoring and protection to the three-phase system 230. The three-phase system 230 may include three conductors 110A, 110B, and 110C associated with the respective A phase, B phase, and C phase.

The arc flash detection and validation system 200 may comprise three circuit breakers 114A, 114B, 114C. The circuit breakers 114A, 114B, 114C may be configured to selectively open and close the three conductors 110A, 110B, and 110C. For example, circuit breaker 114A may selectively open and close conductor 110A.

The arc flash detection and validation system 200 may comprise three CTs 120A, 120B, and 120C, which are associated with the respective A phase, B phase, and C phase of the three-phase system 230. The outputs of CTs 120A, 120B, and 120C may be a proportional lower current value to enable an IED 232 to monitor the phase current value on the conductors 110A, 110B, and 110C at a first point. In one embodiment, CTs 121A, 121B, and 121C may isolate the current on the conductors 110A, 110B, and 110C at a second point. Measuring at two points may create a more robust system and/or provide more accurate measurements.

The arc flash detection and validation system 200 may further comprise three PTs 122A, 122B, and 122C, which correspond with the respective A phase, B phase, and C phase of the three-phase system 230. The outputs of the PTs 122A, 122B, and 122C may be a proportional lower voltage value to enable the IED 232 to monitor the voltage on the conductors 110A, 110B, and 110C at a first point. In one embodiment, PTs 123A, 123B, and 123C may be used to measure the voltage on the conductors 110A, 110B, and 110C at a second point.

The IED 232 may be communicatively coupled to the circuit breakers 114A, 114B, and 114C. This may allow the IED 232 to determine and/or control the state of the circuit breakers 114A, 114B, and 114C. The IED 232 may also be capable of providing arc flash protection using light detection devices 106A, 106B, and 106C. The light detection devices 106A, 106B, and 106C may be positioned such that light generated by an arc flash is the most likely source of light to be detected.

The IED 232 may send a signal over a conductor 211 to an HMI 234, which comprises an AFVSM 238, an analytic module 236, and a display. The AFVSM 238 may store current and voltage values. The analytic module 236 may determine the arc flash hazard level. The display may show a relay-event report that may include the energy of the arc flash.

Figure 3:
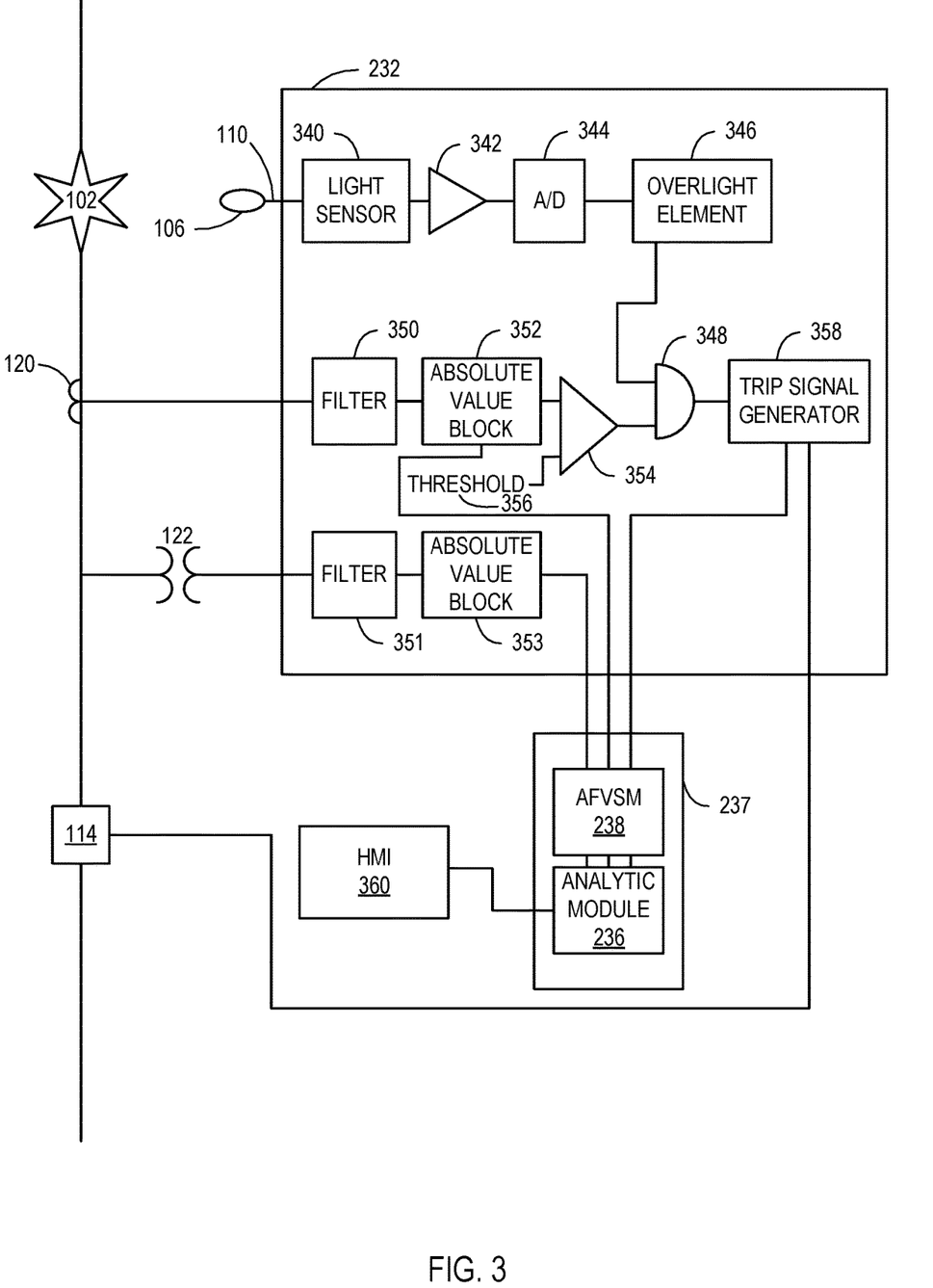
FIG. 3 is a functional block diagram depicting various components of an intelligent electronic device (IED) according to one embodiment.

FIG. 3 is a functional block diagram depicting various components of an IED 232 according to one embodiment. A light detection device 106 may detect light from a light event 102 caused by an arc flash. The light detection device may transmit detected light over a conductor 110 to a light sensor 340. The light sensor 340 may receive the detected portion of light from the light event 102 and convert it into an electrical signal. The electrical signal may then be amplified by an amplifier 342, and transmitted to an A/D converter 344. The A/D converter 344 may send a digital signal to an overlight element 346, which compares the discrete light measurement to a threshold value. If the light measurement exceeds the threshold, then the overlight element 346 sends a signal to an AND gate 348.

A CT 120 may isolate a current signal for measurement. The current signal may be sent to the IED 232, which comprises a filter 350 to convert the current measurement into a discrete value using an A/D converter (not shown). The discrete current measurement values may then flow to an absolute value block 352 to generate an absolute value of the digital current measurements by rectifying the values. The rectified values flow to a comparator 354, which may compare the measurements to a threshold 356. If the current values exceed the threshold 356, then a signal is sent to the AND gate 348.

Further, a PT 122 may isolate a voltage for measurement. The voltage may be transmitted to the IED 232, which filters the voltage using a filter 351 to convert the voltage to a discrete value using an A/D converter (not shown). The discrete value may pass through an absolute value block 353 to generate a rectified value of the digital voltage.

The IED 232 may transmit the rectified voltage and current values to an AFVSM 238 for storage. In some embodiments, if, during an arc flash, the CT and PT become saturated, the IED 232 may include a prediction module that predicts the voltages and currents of the incident based on the measurements before and/or after saturation. In some embodiments, the AFVSM 238 may also store the electrical signal from the light sensor 340. The AFVSM 238 may be a component of a remote server 237. In one embodiment, the AFVSM 238 may store measurements from a plurality of IEDs. In an alternative embodiment, each IED 232 may include an AFVSM 238.

When the AND gate 348 receives a signal from both the overlight element 346 and the comparator 354, the AND gate 348 releases an output to a trip signal generator 358. The trip signal generator 358 may release a signal to a circuit breaker 114 to trip based on the output from the trip signal generator 358.

The remote server 237 may receive digital voltage measurements, digital current measurements, and/or the trip signal from the IED 232. The server 237 may record the time that the trip signal was received and mark the measurements taken at that time as arc flash event measurements. The server 237 may comprise an AFVSM 238 to store digital measurement outputs from the IED 232. The AFVSM 238 may also store predicted incident energy values for an arc flash. The predicted incident energy values may be based on an arc flash study. The server 237 may also include one or more analytic modules 236, which compare the actual digital value measurements stored in the AFVSM 238 to the predicted values that are also stored in the AFVSM 238. The results of the comparison may be indicated and/or published in the form of a relay-event report to an HMI 360. In some embodiments, the AFVSM 238, the analytic modules 236 and the HMI 360 may be part of the IED 232.

Figure 4:
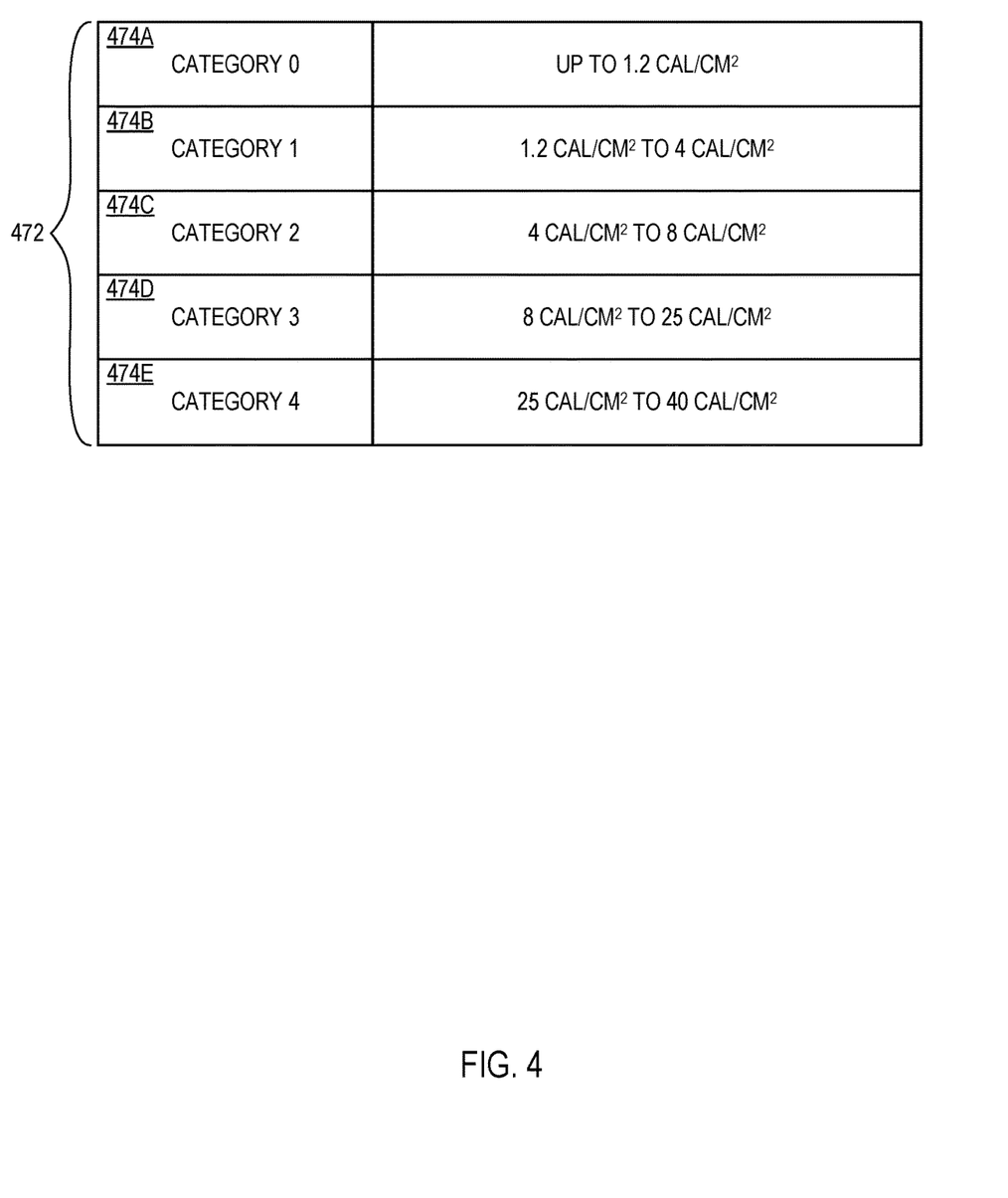
FIG. 4 is a table of arc flash hazard levels, as designated by NFPA 70E, that are stored within an arc flash-validation-system memory (AFVSM), and from which one or more analytic modules compare the actual measurement values.

FIG. 4 is a table of arc flash hazard levels 472 as designated by NFPA 70E. AFVSM may store the values of the table. The arc flash hazard levels 472 include category 0 474A, category 1 474B, category 2 474C, category 3 474D, and category 4 474E. The categories represent increasing energy levels that may be associated with an arc flash.

The arc flash detection and validation system may compare measured incident energy produced by an arc flash with the arc flash hazard levels 472 to determine an arc flash protection boundary. The arc flash hazard level 472 within which an actual value falls indicates what protective clothing, if any, must be worn within the arc flash protection boundary. In some embodiments, the measured incident energy may be slightly different from the actual incident energy of an arc flash because of unknown variables such as enclosure shape, conductor distance, and/or CT saturation or clipping. However, each arc flash hazard level 472 covers a range of energies. Any discrepancies are unlikely to result in the measured incident energy being in a different category than the actual arc flash energy.

Figure 5:
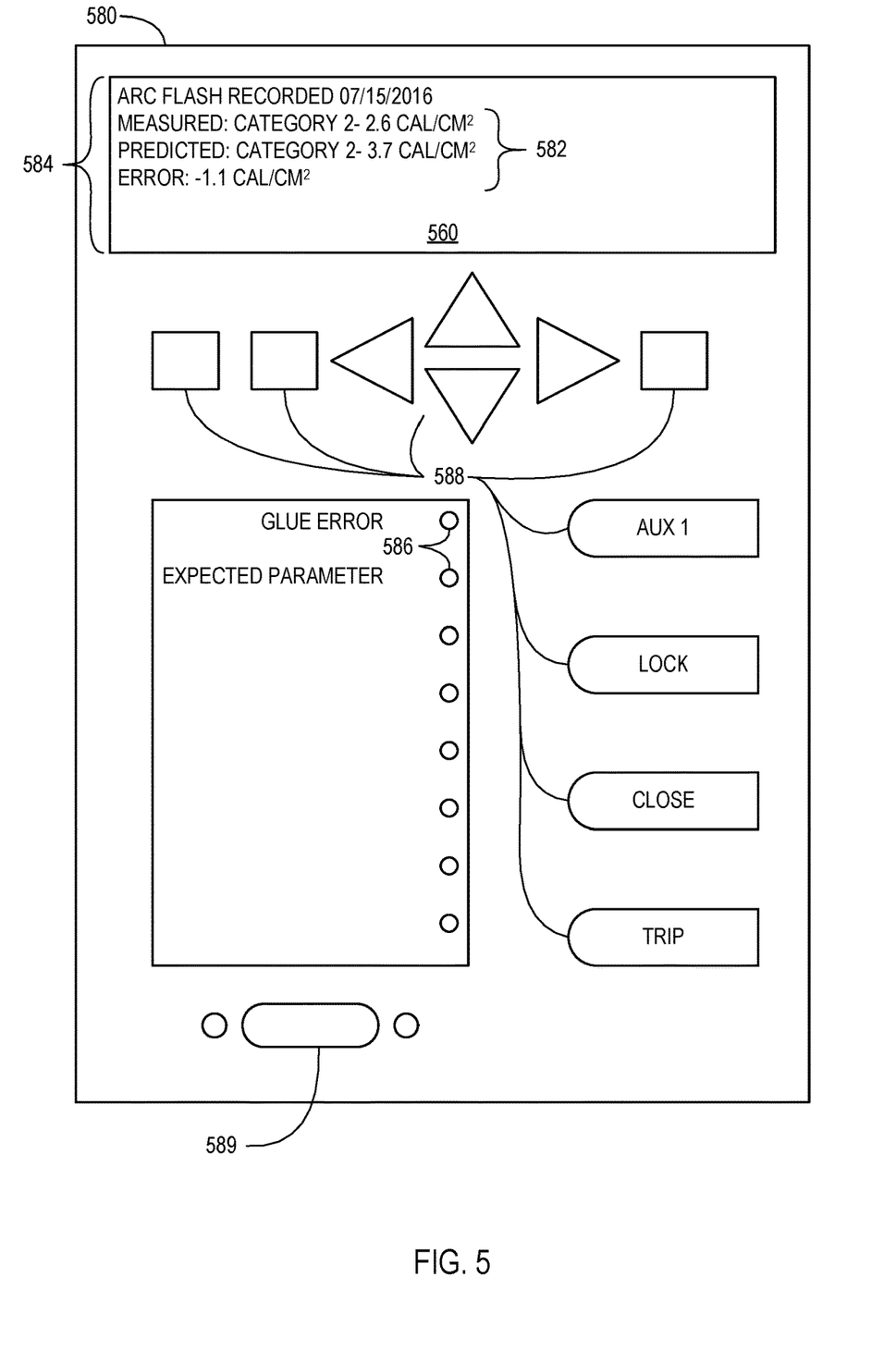
FIG. 5 depicts a human-machine interface (HMI) according to one embodiment.

FIG. 5 depicts an HMI 580, according to one embodiment. In one embodiment, a feeder protection relay may include the HMI 580. The HMI 580 may include one or more buttons 588 and/or ports 589 that act as inputs. The HMI 580 may include one or more processors that run an operating system and generate a relay-event report 560. The HMI 580 may display the relay-event report 360.

In one embodiment, the relay-event report 360 may be in the form of a digital readout 582 displayed upon a screen 584. In another embodiment, the HMI 580 may present the relay-event report 360 with a series of LEDs 586. The relay-event report 360 may include the measured and predicted arc flash energy, the arc flash hazard category of the arc flash, and the difference between the measured and predicted arc flash energy. The relay-event report 360 may also include a warning that the predicted arc hazard category was inaccurate and advise that additional protective measures be taken. The relay-event report 360 may also indicate that the breaker is not operating within the expected parameters. The expected parameters may be adjusted, or the relay may be replaced based on the relay-event report 360.

Figure 6A:
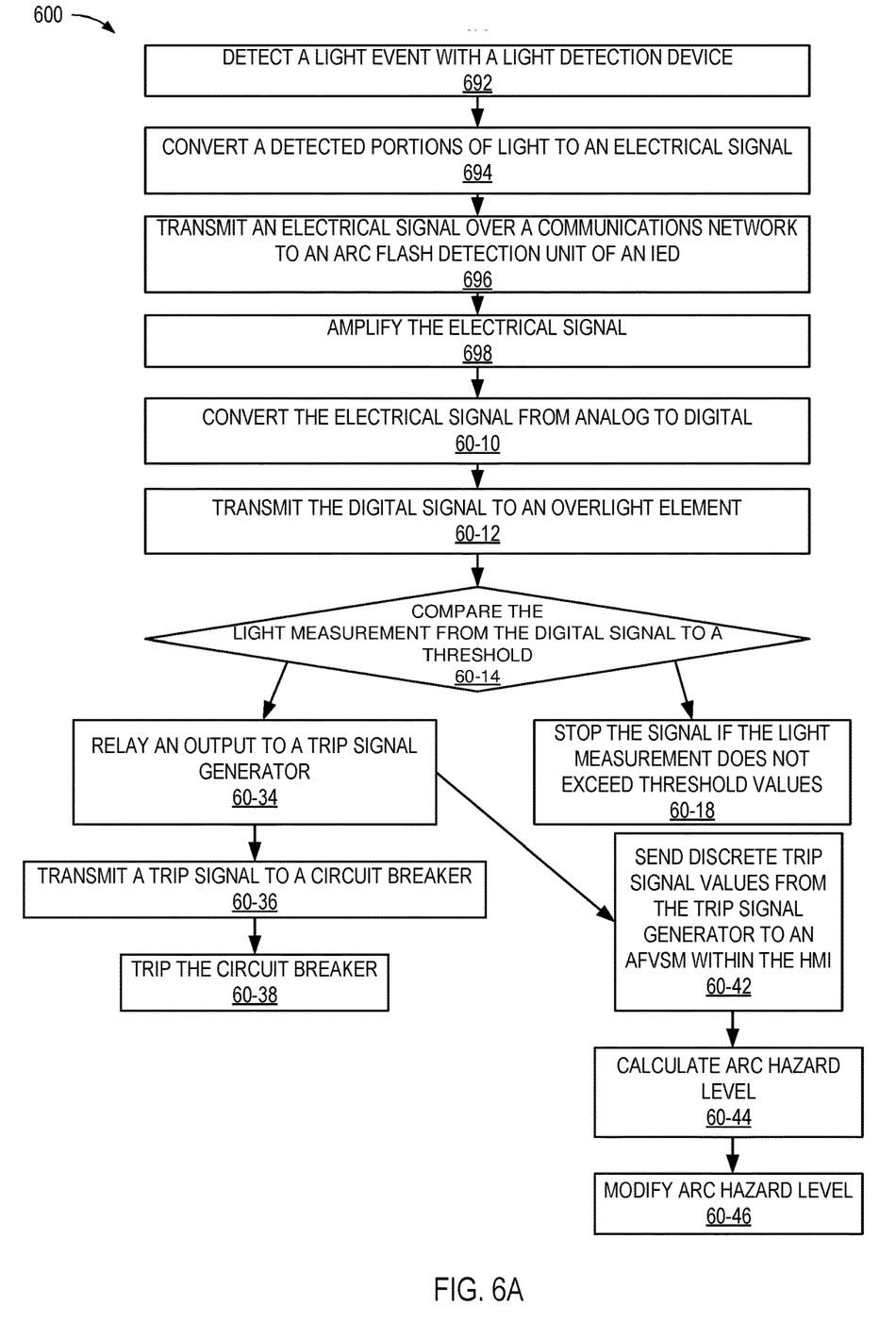
FIGS. 6A, 6B, and 6C are flow charts of methods for comparing actual arc flash measurement values to predicted arc flash measurement values, according to one embodiment.
Figure 6B:
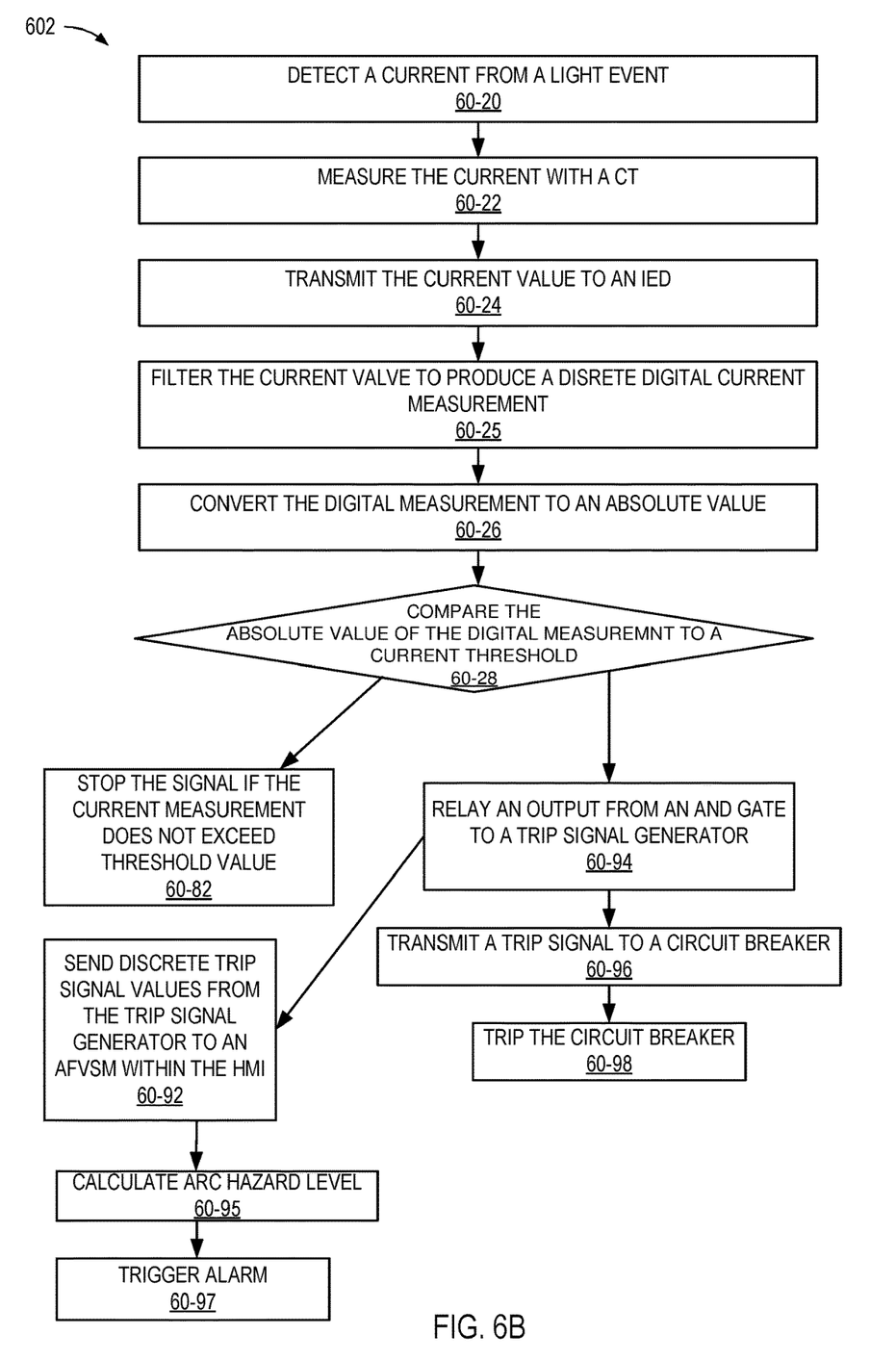
Figure 6C:
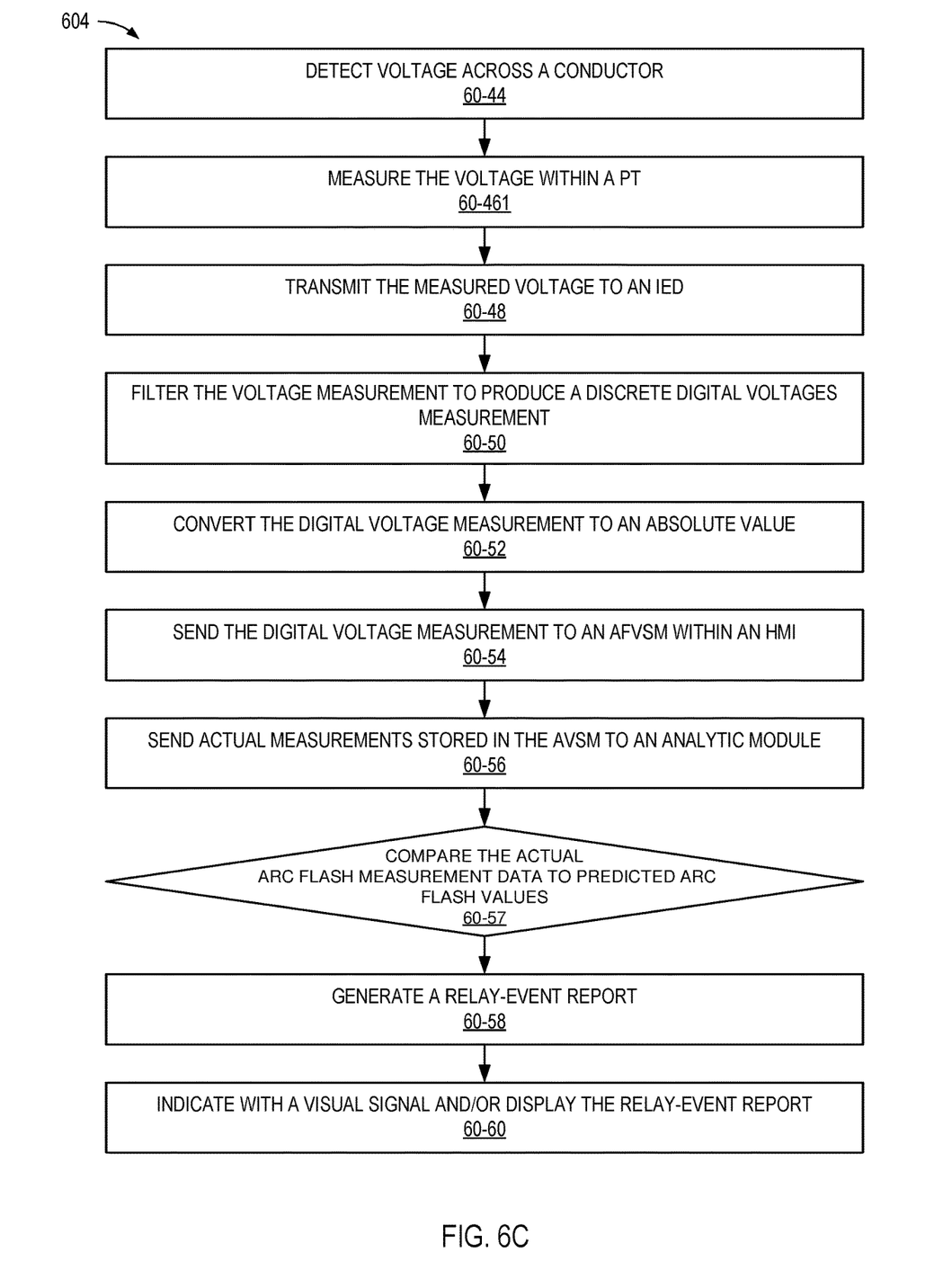

FIGS. 6A-6C are flow charts of methods for comparing actual arc flash measurement values to predicted arc flash measurement values.

A first method 600 may include detecting 692 a light event with a light detection device, and converting 694 a detected portion of light to an electrical signal. The first method 600 may also include transmitting 696 an electrical signal over a communications network to an arc flash detection unit of an IED, and amplifying 698 the electrical signal. The first method 600 may further comprise converting 60-10 the electrical signal from analog to digital, and transmitting 60-12 the digital signal to an overlight element.

Additionally, the first method 600 may include comparing 60-14 the light measurement from the digital signal to an overlight threshold. If the light measurement exceeds the threshold values, the first method 600 may include relaying 60-34 an output signal to a trip signal generator. If the light measurement does not exceed the threshold, the first method 600 may stop 60-18 the signal.

The trip signal generator may transmit 60-36 a trip signal to a circuit breaker. The first method 600 may further comprise tripping 60-38 the circuit breaker. The method may also include sending 60-42 discrete trip signal values from the trip signal generator to an AFVSM within an HMI. The first method 600 may calculate 60-44 the arc hazard level based on current and voltage measurements taken during the event. If an estimated arc flash hazard level is stored, the first method 600 may modify 60-46 the estimated arc hazard level based on the calculated arc hazard level.

A second method 602 may include detecting 60-20 a current from a light event, and measuring 60-22 the current with a CT. The second method 602 may comprise transmitting 60-24 the current value to an IED, and filtering 60-25 the current value to produce a discrete digital current measurement. The second method 602 may further include converting 60-26 the digital current measurement to an absolute value, and comparing 60-28 the absolute value of the digital current measurement to a current threshold. Additionally, the second method 602 may include relaying 60-94 the current measurement to a trip signal generator if the current measurement exceeds the current threshold values, or stopping 60-82 the signal if the current measurement does not exceed the current threshold values. The second method 602 may include sending 60-27 the absolute value of the digital current measurement to an AFVSM within an HMI.

The trip signal generator may transmit 60-96 a trip signal to a circuit breaker. The second method 602 may further comprise tripping 60-98 the circuit breaker. The method 602 may also include sending 60-92 discrete trip signal values from the trip signal generator to an AFVSM within an HMI. The second method 602 may calculate 60-94 the arc hazard level based on current and voltage measurements taken during the event, and trigger 60-97 an alarm if the actual arc hazard level is greater than the predicted arc hazard level. The alarm may be visual and/or auditory.

A third method 604 may include detecting 60-44 voltage across a conductor, and measuring 60-461 the voltage within a PT. The method 604 may also include transmitting 60-48 the voltage measurement to an IED, and filtering 60-50 the voltage measurement to produce a discrete digital voltage measurement. The method 604 may further include converting 60-52 the digital voltage measurement to an absolute value, and sending 60-54 the absolute value of the digital voltage measurement to an AFVSM within a HMI.

The method 604 may additionally comprise sending 60-56 actual measurements stored in the AFVSM to an analytic module, and comparing 60-57 the actual arc flash measurement data to predicted arc flash values. The method 604 may also include generating 60-58 a relay-event report, and indicating 60-60 with a visual signal and/or display the relay-event report.

The three methods 600, 602, 604 described in FIGS. 6A-6C may be used independently or in combination. For example, in some embodiments, a current and light that exceed the threshold values may be required.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure.

This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims following this description are hereby expressly incorporated into this description, with each claim standing on its own as a separate embodiment. This disclosure includes all permutations of the independent claims with their dependent claims.

Recitation in the claims of the term "first" with respect to a feature or element does not necessarily imply the existence of a second or additional such feature or element. Elements recited in means-plus-function format are intended to be construed in accordance with 35 U.S.C. § 112(f).

It will be apparent to those having skill in the art that changes may be made to the details of the above-described embodiments without departing from the underlying principles of the invention. Embodiments of the invention in which an exclusive property or privilege is claimed are defined as follows.

What is claimed is:

1. An arc flash detection and validation system, comprising:
    a potential transformer configured to provide output voltage values based on voltage on an electrical conductor;
    a current transformer configured to provide output current values based on current on the electrical conductor;
    a detection component to determine if an arc flash event occurred;
    an intelligent electronic device comprising:
    a memory;
    a processor operatively coupled to the memory, wherein the processor is configured to:
        receive the output voltage values and the output current values during a time period corresponding to a determined arc flash event;
        calculate a measured arc hazard level based on the received output current values measured from the current transformer and output voltage values measured from the potential transformer; and
        generate a relay-event report that compares the measured arc hazard level and an estimated arc hazard level; and
    a human-machine interface to present the relay-event report.

2. The arc flash detection and validation system of claim 1, further comprising a plurality of current transformers and a plurality of power transformers.

3. The arc flash detection and validation system of claim 1, further comprising a hazard redefinition module that modifies the estimated arc hazard level based on the measured arc hazard level.

4. The arc flash detection and validation system of claim 1, wherein the intelligent electronic device comprises a relay.

5. The arc flash detection and validation system of claim 4, wherein the human-machine interface is integrated in the relay.

6. The arc flash detection and validation system of claim 1, wherein the relay-event report defines a safety zone based on the measured arc hazard level.

7. The arc flash detection and validation system of claim 1, further comprising a circuit breaker in communication with the intelligent electronic device.

8. The arc flash detection and validation system of claim 7, wherein the relay-event report indicates actual operating parameters of the circuit breaker based on the output current and output voltage values.

9. The arc flash detection and validation system of claim 1, wherein the intelligent electronic device determines that an arc flash event occurred based on:
    the light detection device detecting light, and
    one of an overcurrent in the output current values and an overvoltage in the output voltage values.

10. The arc flash detection and validation system of claim 1, further comprising a plurality of intelligent electronic devices, and wherein a storage device stores output current and voltage values for each of the plurality of intelligent electronic devices.

11. The arc flash detection and validation system of claim 1, wherein the detection component comprises at least one light detection device to detect light from an arc flash event.

12. The arc flash detection and validation system of claim 1, wherein the detection component comprises a power detector that detects at least one of current and voltage spikes.

13. A method for verifying an arc hazard level associated with an electrical conductor, comprising:
    identifying a stored predicted arc hazard level associated with an electrical conductor;
    detecting, by a light detection device, a light event associated with the electrical conductor;
    converting a detected portion of light to an electrical light signal;
    measuring, via a current transformer, a current during the detected light event to produce a current measurement associated with the electrical conductor;
    measuring, via a potential transformer, a voltage during the detected light event to produce a voltage measurement associated with the electrical conductor;
    transmitting the electrical light signal, the current measurement, and the voltage measurement to an intelligent electronic device;
    comparing the electrical light signal to an overlight threshold;
    comparing the current measurement to a current threshold;
    determining that an arc flash event has occurred when:
        the electrical light signal exceeds the overlight threshold, and
        the current measurement exceeds the current threshold;
    calculating an actual arc hazard level based on the current measurement from the current transformer and voltage measurement from the potential transformer;
    comparing the predicted arc hazard level with the actual arc hazard level;
    generating a relay-event report based on the comparison of the predicted arc hazard level with the actual arc hazard level; and
    modifying the stored predicted arc hazard level based on the calculated actual arc hazard level.

14. The method of claim 13, wherein modifying the stored predicted arc hazard level is only performed when the actual arc hazard level is greater than the predicted arc hazard level.

15. The method of claim 13, wherein the relay-event report defines a safety zone based on the calculated actual arc hazard level.

16. The method of claim 13, further comprising transmitting a trip signal to a circuit breaker based on a determination that an arc flash event has occurred.

17. The method of claim 16, wherein the relay-event report indicates actual operating parameters of the circuit breaker based on the current measurement and voltage measurement.

18. The method of claim 13, further comprising triggering an alarm based on a determination that the actual arc hazard level is greater than the predicted arc hazard level.

19. The method of claim 18, wherein the alarm comprises a visual signal.

20. The method of claim 19, wherein the alarm comprises an auditory signal.

21. A non-transitory computer-readable medium with instructions stored thereon that, when executed by a processor, cause an intelligent electronic device to perform operations for verifying an arc hazard level, the operations comprising:

receiving a predicted arc hazard level associated with an electrical conductor;

determining that an arc flash event occurred;

receiving, from a potential transformer, a voltage measurement associated with the electrical conductor during the arc flash event;

receiving, from a current transformer, a current measurement associated with the electrical conductor during the arc flash event;

determining estimated current measurements based on the current measurements of the current transformer before saturation, after saturation, or both;

calculating an actual arc hazard level based on the voltage and the estimated current measurements;

comparing the predicted arc hazard level with the actual arc hazard level; and generating a relay-event report identifying a difference between the predicted arc hazard level and the actual arc hazard level.

22. The non-transitory computer-readable medium of claim 21, further comprising triggering an alarm if the actual arc hazard level is greater than the predicted arc hazard level.

* * * * *